United States Patent [19]

Kessler

[11] Patent Number: 4,953,497
[45] Date of Patent: Sep. 4, 1990

[54] APPARATUS FOR COATING CONTINUOUS WEBS

[75] Inventor: Hans Kessler, Hanau, Fed. Rep. of Germany

[73] Assignee: Leybold Aktiengesellschaft, Hanau, Fed. Rep. of Germany

[21] Appl. No.: 115,263

[22] Filed: Oct. 30, 1987

[30] Foreign Application Priority Data

Aug. 6, 1987 [DE] Fed. Rep. of Germany ....... 3726113

[51] Int. Cl.$^5$ .............................................. C23C 14/00
[52] U.S. Cl. .................................... 118/718; 118/733; 118/50; 427/255.5; 414/217
[58] Field of Search ........................ 118/718, 733, 50; 427/255.5; 414/217

[56] References Cited

U.S. PATENT DOCUMENTS

| | | | |
|---|---|---|---|
| 3,086,889 | 4/1963 | Strong | 118/718 |
| 3,110,624 | 11/1963 | McGraw | 118/718 |
| 3,123,499 | 3/1964 | Tassara | 118/718 |
| 4,423,956 | 1/1984 | Gordon | 118/718 |

Primary Examiner—Richard Bueker
Attorney, Agent, or Firm—Felfe & Lynch

[57] ABSTRACT

An apparatus for vacuum coating continuous web materials has a housing with a removable cover disposed on at least one side for the hermetic closure of the housing, and a winding means having pulley cylinders, tension measuring cylinders, stretching cylinders and tightening cylinders journaled between two plates, plus at least one coating cylinder and at least one take-up roll and at least one feed roll, as well as a coating source held stationary in the housing. The two plates together with the cylinders and rolls are able to travel as a unit on a running gear for the purpose of loading and unloading, to such an extent that all cylinders are freely accessible from without. A transport means which can move transversely to the tracks of the running gear is provided with pairs of arms journaled on the running gear. The common pivot axis of the pairs of arms is disposed parallel to the tracks. The free ends of the pairs of arms are equipped with supporting eyes for holding one fresh roll and one take-up roll.

4 Claims, 2 Drawing Sheets

APPARATUS FOR COATING CONTINUOUS WEBS

BACKGROUND OF THE INVENTION

The invention relates to an apparatus for vacuum coating continuous webs of material, having a housing, a removable cover disposed on at least one side for the hermetic closure of the housing, and a winding means having pulley cylinders and tension measuring, stretching and tension cylinders journaled between two plates, plus at least one coating cylinder and at least one supply roll and at least one take-up roll, as well as a coating source held fixedly in the housing, the two plates together with the cylinders being movable as a unit on a running gear for loading and unloading purposes, to such an extent that all cylinders are accessible from without.

It has been common practice heretofore to use cranes or lift trucks for inserting and removing rolls of film and continuous web materials in vacuum coating apparatus. This, however, is time-consuming and laborious, and has especially the disadvantage that the coating apparatus has to be taken out of operation for a relatively long period of time, thereby reducing its productivity.

It is the object of the present invention to design an apparatus of the kind described above such that fast roll changing will be possible and can be performed largely by a single operator. The apparatus that makes the roll changing possible is to be inexpensive to manufacture and easy to operate. Lastly, the apparatus is to require no alterations of the housing or winding apparatus, so that these parts will remain freely dimensionable and can be configured from the point of view of optimum roll management and coating quality.

SUMMARY OF THE INVENTION

This object is achieved according to the invention by a transport means which can be moved transversely of the tracks, and which has pairs of arms journaled thereon whose axes of rotation are parallel to the tracks, while the free ends of the pairs of arms are equipped with supporting eyes for the mounting of one supply roll and one take-up roll.

Preferably the transport means can run on wheels, in which case the distance between the pivot axes of the pairs of arms and the standing surface is such that the first pair of arms which are to extend upwardly at an angle of 45° to the base surface reaches with its supporting eyes all the way to the bearings provided for the take-up roll, while the second pair of arms which are to extend downwardly at an angle will reach simultaneously to the location of the bearings provided for the supply roll.

Advantageously, the pairs of arms are of equal length, and the distance between the supporting eyes of the first pair of arms and the supporting eyes of the second pair of arms is equal to the distance between the supporting eyes of the second pair and those of the third pair of arms.

Advantageously, a locking device disposed between the pairs of arms on the one hand and the fork for mounting the pivot axis on the other hand is provided, which is adapted for locking the pairs of arms against pivoting about their common axis.

The invention admits of a great variety of embodiments; one of them is represented in a purely diagrammatical manner in the appended drawing, wherein.

Figure 1:
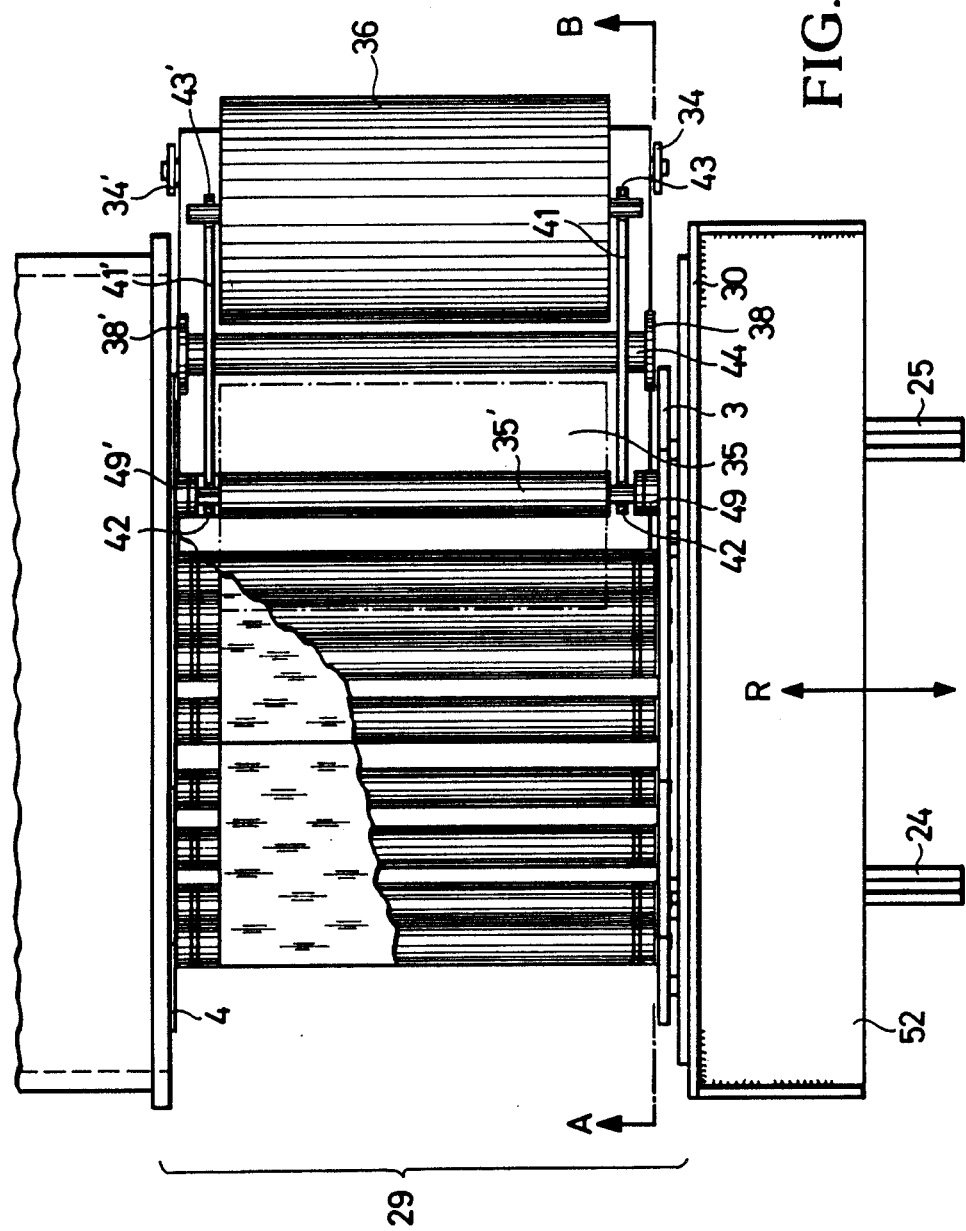
FIG. 1 is a top plan view of a portion of a continuous web coating apparatus whose winding apparatus has been moved out of the coating chamber, which is in the form of a hollow cylinder, for the roll loading procedure.
Figure 2:
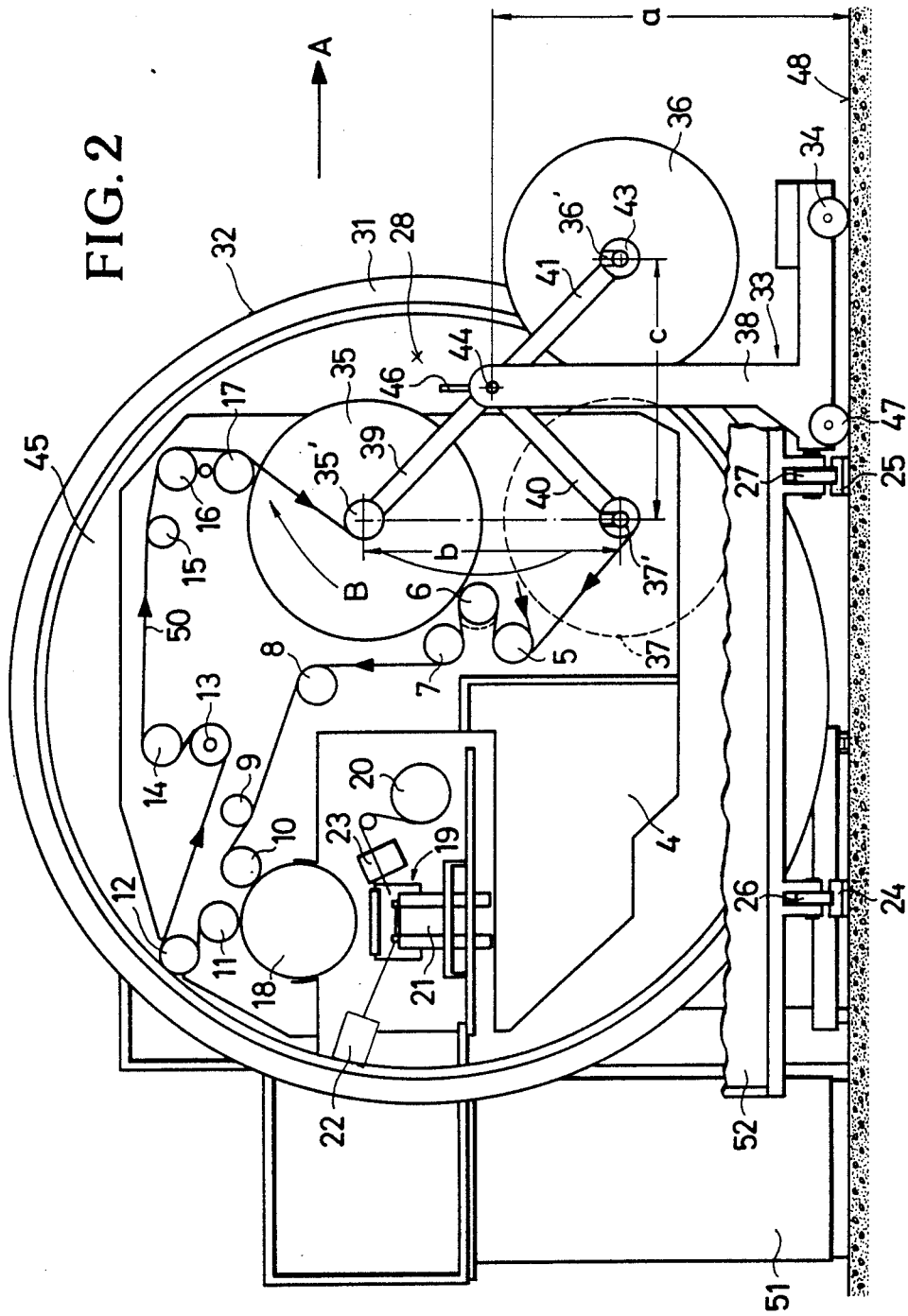
FIG. 2 is a side elevation of the apparatus according to FIG. 1, in a section taken along line A-B in FIG. 1, a number of the pulley cylinders and tightening cylinders represented in FIG. 1 having been omitted for ease of comprehension.

The continuous web coating apparatus, depicted in FIGS. 1 and 2 of the drawings, consists essentially of the pulley cylinders, tension measuring cylinders, stretching cylinders and tightening cylinders 5 to 17 and the cooled coating cylinder 18, the feed roll 37' and the take-up roll 35', the evaporation source 19 disposed in the coating chamber 28 formed of a hollow cylinder 32, with aluminum wire spool 20 and the evaporation crucible 21 and a television camera 22 for observing the coating process. Together with the cylinders 5 to 17 and the coating cylinder 18 which form the winding system 29, the two plates 3 and 4 fastened to the supporting frame 52 can be rolled in the direction of the arrow R into and out of the coating chamber 28 on wheels 26 and 27 running on tracks 24 and 25. With the winding system 29 rolled in, the margins of the disk-like cover 30 fixedly disposed on the supporting frame apply themselves against the flange-like end 31 of the hollow cylinder 32, where it is affixed by clamps, not shown, to the hollow cylinder 32 and drawn against the end 31 by the vacuum below the atmospheric pressure prevailing in chamber 45 during the working phase.

As the figures show, a transport means 33 equipped with wheels 34–34'; 47–47') can be rolled up close to the winding system 29. The transport means 33 is provided with a mounting for the take-up roll 35, the fresh roll 36 and the feed roll 37. For this purpose it has three pairs of arms 39, 40 and 41, journaled on the fork 38 and fixed together for rotation therein, at whose extremities the supporting eyes 42–42' and 43–43', respectively, of the pairs of arms 39, 40, 41, are situated. After a coating process, when a coated web is fully wound onto the take-up roll 35', this take-up roll 35 can be taken out in the direction of the arrow A by the transport means after loosening the take-up roll 35' between the plates 3 and 4. Preferably, a fresh roll 36 has been placed on the pair of arms 41–41', in the supporting eyes 43–43', so that the weight of the take-up roll 35 is approximately counterbalanced, and the pair of arms 39–39', can be rotated effortlessly clockwise (direction of arrow B) about the axis 44, until the fresh roll 36 has reached the position of the feed roll 37 indicated in broken lines, where the fresh roll 36' can be inserted or journaled as a feed roll 37 between the two plates 3, 4. Preferably, all arm pairs 39–39', 40–40' and 41–41' are of equal length, so that if the fresh rolls 35 and 36 are of approximately equal weight there will be no difficulty in handling the rolls and loading and unloading the apparatus. On the fork 38, finally, there is provided a locking means 46 by which the shaft 44 on which the arm pairs 39, 40 and 41 are mounted can be locked against unintentional turning.

It is clear that the above-described transport means 33 is also suitable for raising the feed roll 37', when it is empty after a coating run, and when the take-up roll 36 is swung in the direction of the arrow B, into the position of the take-up roll 35' where it can then be set in the place of the previously suspended and turned-out full take-up roll 35, the fresh roll 36 being simultaneously swung into the position indicated in broken lines in FIG. 2. Cyclically performed, the procedure described permits a considerable saving of time, especially because the formerly practiced manipulation with a crane and a lift truck is completely eliminated. The coupling of the rolls 35'-36'-37' to the stubshafts 49-49' journaled in the side plates 3 and 4 is not shown in detail in the drawings; for example, the stubshafts 49-49' can be made partially in the form of two shells, so that, after the removal of the one supporting eye the corresponding end of the roll 35'-36'-37' can be laid into the open bearing eye and then can be held in place with the corresponding second bearing eye, and the roll can be swung effortlessly clockwise about the axis 44 (arrow direction B) until the fresh roll 36 has reached the position of feed roll 37 indicated by broken lines, where then the fresh roll 36' can be inserted or journaled as the feed roll 37 between the two plates 3 and 4. Preferably, all arm pairs 39-39', 40-40' and 41-41' are of equal length, so that if the fresh rolls 35 and 36 are of approximately equal weight there will be no difficulty in handling the rolls and loading and unloading the apparatus. On the fork 38, finally, there is provided a locking means 46 by which the shaft 44 on which the arm pairs 39, 40 and 41 can be locked against unintentional turning.

I claim:

1. An apparatus for vacuum coating continuous web materials comprising a housing, a removable cover disposed on at least one side of said housing for the hermetic closure of same, winding means comprising pulley cylinders, tension measuring cylinders, stretching cylinders and tightening cylinders journaled between two plates, plus at least one coating cylinder, means for coating said web held stationary in said housing and positioned along the web path between said feed roll and said take up roll, at least one take-up roll, at least one feed roll and at least one fresh roll, said two plates containing therebetween said cylinders and said rolls, being so arranged to form a unit, said unit being capable of traveling on rolling means on tracks, thereby enabling the loading and unloading of said apparatus, with the result that all of said cylinders and said rolls are freely accessible from without said housing; and transport means which can move transversely to said tracks used in conjunction with said unit, said transport means being provided with pairs of arms journaled on said rolling means, the common pivot axis of said pairs of arms being disposed parallel to said tracks, and the free ends of said pairs of arms being equipped with supporting eyes for holding one fresh roll and one take-up roll.

2. The apparatus according to claim 1, wherein said transport means moves on wheels the distance between said pivot axis for said arm pairs and the base surface which said apparatus being such that a first arm pair that is to extend upwardly at an angle of 45° to the base surface reaches with its supporting eyes to the bearing locations for said take-up roll, while said second arm pair reaches downwardly at an angle, concurrently reaches the bearing locations of the free roll.

3. The apparatus according to claim 2 wherein said arm pairs are of equal length and the distance between the supporting eyes of said first arm pair and the supporting eyes of said second arm pair is equal to the distance between the supporting eyes of said second and those of said third arm pair.

4. The apparatus according to claim 3 wherein a locking means is disposed between said first, second and third arm pairs and a fork for the mounting of said pivot shaft on the other, said locking means being adapted for locking the arm pairs against a rotation about their common axis.

* * * * *